United States Patent [19]

Hernandez et al.

[11] Patent Number: 4,734,819
[45] Date of Patent: Mar. 29, 1988

[54] DECOUPLING CAPACITOR FOR SURFACE MOUNTED LEADLESS CHIP CARRIER, SURFACE MOUNTED LEADED CHIP CARRIER AND PIN GRID ARRAY PACKAGE

[75] Inventors: Jorge M. Hernandez; Rodney W. Larson, both of Mesa, Ariz.

[73] Assignee: Rogers Corporation, Rogers, Conn.

[21] Appl. No.: 27,739

[22] Filed: Mar. 19, 1987

Related U.S. Application Data

[63] Continuation-in-part of Ser. No. 890,489, Jul. 25, 1986, Pat. No. 4,667,267, which is a continuation-in-part of Ser. No. 811,673, Dec. 20, 1985, Pat. No. 4,626,958, which is a continuation of Ser. No. 693,189, Jan. 22, 1985, abandoned.

[51] Int. Cl.⁴ .......................... H01G 1/14; H01C 1/01
[52] U.S. Cl. ................................ 361/306; 174/52 FP
[58] Field of Search ........ 361/433, 328, 329, 402–404, 361/321, 306, 322; 174/52 FP

[56] References Cited

U.S. PATENT DOCUMENTS

| | | | |
|---|---|---|---|
| 3,264,709 | 8/1966 | Lupfer | 361/321 X |
| 3,617,817 | 11/1971 | Kawakatsu et al. | 174/52 FP X |
| 4,385,342 | 5/1983 | Puppolo et al. | 361/433 |
| 4,494,169 | 1/1985 | Watson | 361/306 |

Primary Examiner—Donald A. Griffin
Attorney, Agent, or Firm—Fishman & Dionne

[57] ABSTRACT

Several embodiments of a decoupling capacitor are described which incorporate at least one multilayer capacitive element and which utilize metallized dielectric (i.e., ceramic) substrates rather than a pair of conductors. Also, several types of multilayer ceramic capacitor elements are disclosed which provide a low induction parallel-plate type capacitive structure. The decoupling capacitor assemblies of the present invention are specifically sized and configured so as to be either received in the space directly below the integrated circuit chip and between the downwardly extending pins of a PGA package or "leaded" chip carrier package or to be mounted directly over a "leadless" chip carrier package.

39 Claims, 22 Drawing Figures

DECOUPLING CAPACITOR FOR SURFACE MOUNTED LEADLESS CHIP CARRIER, SURFACE MOUNTED LEADED CHIP CARRIER AND PIN GRID ARRAY PACKAGE

BACKGROUND OF THE INVENTION

This invention relates to the field of decoupling capacitors for integrated circuits. More particularly, this invention relates to novel and improved decoupling capacitors especially suitable for use in conjunction with Pin Grid Array (PGA) type integrated circuit packages and leaded and leadless chip carrier packages for surface mounted integrated circuits.

It is well known in the field of microelectronics that high frequency operation, particularly the switching of integrated circuits, can result in transient energy being coupled into the power supply circuit. Generally, the prevention of the coupling of undesired high frequency noise or interference into the power supply for an integrated circuit is accomplished by connecting a decoupling capacitor between the power and ground leads of the IC. One connection scheme utilizes a capacitor which is mounted on a multilayer printed circuit board, outside the integrated circuit with plated through holes used to connect the capacitor to the internal power and ground planes, which in turn make contact with the power supply connection leads of the integrated circuit. A less preferred method (in terms of higher inductance) is to interconnect the decoupling capacitor and integrated circuit power and ground leads via traces on either a multilayer or double sided printed circuit board.

The above two decoupling techniques suffer from several deficiencies. The most serious of these deficiencies resides in the fact that the circuits, including the capacitors, become highly inductive at high frequencies as a consequence of the shape and length of the leads and interconnection traces between the discrete capacitor and the integrated circuit which it decouples. In fact, the inductance of the leads and printed circuit board traces may be sufficiently high to nullify the high frequency effect of the capacitor in the circuit. A second serious deficiency resides in the spatial inefficiency incident to employing a capacitor adjacent to the integrated circuit. The space requirements i.e., real estate, of the decoupling capacitor and the interconnection traces on the printed circuit board adversely affect the optimum component packaging density which can be achieved on the board.

In an effort to overcome the above-discussed deficiencies associated with the use of decoupling capacitors mounted on a printed circuit board, a decoupling capacitor which is adapted to be mounted underneath a conventional dual-in-line circuit has been proposed. U.S. Pat. No. 4,502,101 (which is assigned to the assignee hereof, and the entire contents of which are incorporated herein by reference) discloses a decoupling capacitor for an integrated circuit package. The decoupling capacitor of that prior patent is a thin rectangular chip of ceramic material which is metallized on opposite sides and has two electrically active leads from the metallized coatings on opposite sides of the chip at two points adjacent a pair of diagonally opposed corners of the rectangularly shaped ceramic chip. The capacitor may also contain two or more electrically inactive dummy leads. The two active (and dummy) leads are bent downwardly, and the decoupling capacitor assembly is encapsultated in a film of non-conductive material. In accordance with the teachings of that prior patent, the decoupling capacitor is dimensioned so as to be received in the space between the two rows of leads extending from a conventional dual-in-line integrated circuit. The two electrically active leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two electrically active capacitor leads have been inserted. U.S. Pat. No. 4,636,918, which is also assigned to the assignee hereof and incorporated herein by reference, discloses a decoupling capacitor element which is mounted either above a dual-in-line integrated circuit package or on the back side of a circuit board in alignment with a dual-in-line integrated circuit package.

While suitable for its intended purposes, the decoupling capacitors described in U.S. Pat. Nos. 4,502,101 and 4,636,918 are not particularly adapted to be used in conjunction with Pin Grid Array (PGA) type integrated circuit packages or surface mounted chip carrier type integrated circuit packages of the "leaded" or "leadless" types. PGA packaging and surface mounted chip carrier packaging are becoming a commonly used IC packaging technology. As with conventional dual-in-line packages, PGA packages and surface mounted chip carrier packaging require similar decoupling across the power and ground leads. However, decoupling capacitors of the type disclosed in the above discussed patents have a structure and configuration which preclude their usage in conjunction with the distinctive configuration of well known PGA and surface mounted integrated circuit packages.

U.S. Pat. No. 4,626,958 overcomes the above problems and deficiencies by providing a decoupling capacitive structure which is particularly well suited for use in conjunction with Pin Grid Array type integrated circuit packages. Similarly, U.S. patent application Ser. No. 763,826 filed Aug. 8, 1985, now U.S. Pat. No. 4,658,327 issued Apr. 14, 1987, discloses a decoupling capacitor for use in conjunction with a surface mounted plastic leaded chip carrier. The decoupling capacitor of U.S. Ser. No. 763,826 is particularly adapted for mounting between a printed wiring board and a surface mounted integrated circuit. Finally, U.S. patent application Ser. No. 890,489 filed July 25, 1986, now U.S. Pat. No. 4,667,267, relates to a decoupling capacitor for use with a PGA package wherein the decoupling capacitor has at least one multilayer capacitive element in an effort to achieve higher capacitance values and increased temperature stability. U.S. Pat. No. 4,626,958 and U.S. patent application Ser. Nos. 763,826 and 890,489 are all assigned to the assignee hereof and the entire contents are incorporated herein by reference thereto.

While well suited for their intended purposes, there is a perceived need for decoupling capacitors for PGA packages and surface mounted chip carriers of the leaded and leadless type which have the ability to perform other important functions. For example, there is a need for a decoupling capacitor for use with surface mounted leadless and leaded chip carriers having increased capacitance by incorporation of a multilayer capacitive element therein. Also, there is a need for a decoupling capacitor for use with surface mounted leadless (as opposed to "leaded") chip carriers which can be mounted over the leadless chip carrier rather than between the chip carrier and the printed wiring board. Finally, there is also a need for decoupling capacitors for both PGA packages and surface mounted chip carriers which are comprised of metallized dielectric (i.e., ceramic) substrates which combine the decoupling function with that of a heat sink.

SUMMARY OF THE INVENTION

In accordance with the present invention, a decoupling capacitor adapted for mounting directly over a "leadless" surface mounted chip carrier or under a "leaded" surface mounted chip carrier type integrated circuit package is provided which will result in a lower decoupling loop, thus providing a more effective decoupling scheme. The decoupling capacitor of the present invention may also be mounted under a PGA type integrated circuit package. The capacitor of the present invention contributes to a savings in board space, i.e., takes up less "real estate" on the printed circuit board, by resting entirely over the leadless chip carrier package or under the leaded chip carrier or PGA package.

In an effort to achieve higher capacitance values and increased temperature stability, several embodiments of the present invention are described which incorporate at least one multi-layer capacitive element and which utilizes metallized dielectric (i.e., ceramic) substrates rather than a pair of conductors. Also, several types of multilayer ceramic capacitor elements are disclosed which provide a low induction parallel-plate type capacitive structure. The decoupling capacitor assemblies of the present invention are specifically sized and configured so as to be either received in the space directly below the integrated circuit chip and between the downwardly extending pins of a PGA package or "leaded" chip carrier package; or to be mounted directly over a leadless chip carrier package. It is well known that PGA, leaded and leadless chip carrier packages have many different types of pin configurations. Accordingly, the present invention has flexible lead locations and multiple pins from each voltage level of the PGA or surface mounted chip carrier so as to be tailored to a particular PGA or surface mounted chip carrier package.

The above-discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
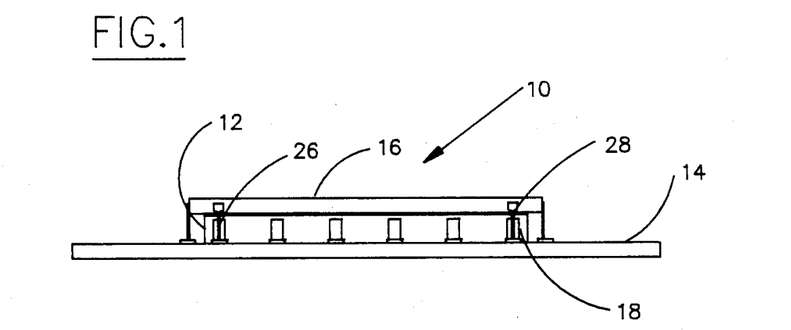
FIG. 1 is a side elevational view of a leadless chip carrier integrated circuit package sandwiched between a decoupling capacitor and a printed wiring board in accordance with the present invention.
Figure 2:
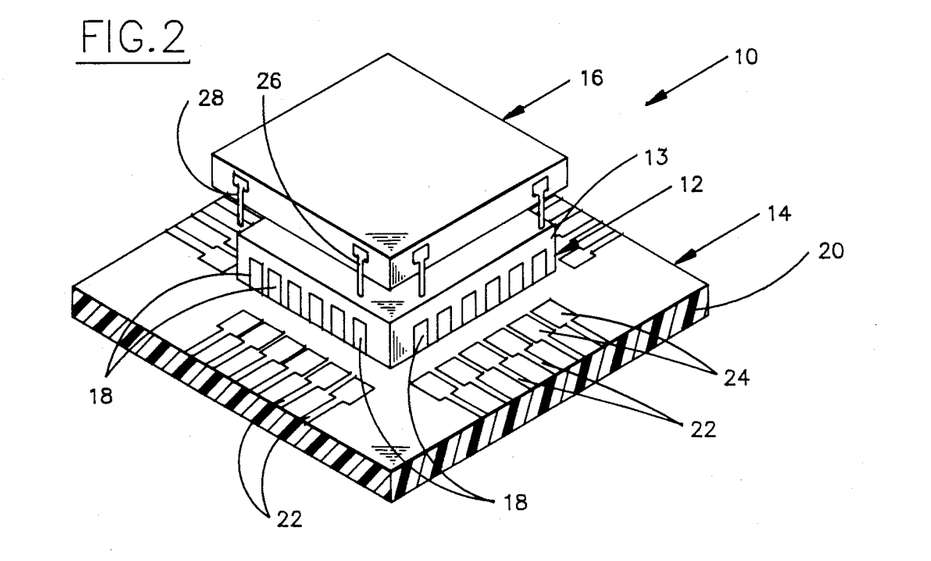
FIG. 2 is an exploded view of the subassembly shown in FIG. 1.

Referring first to FIGS. 1 and 2, a subassembly is shown generally at 10 comprising a well known surface mountable leadless chip carrier (LCC) integrated circuit package 12 sandwiched between a printed wiring board 14 and a decoupling capacitor 16. As mentioned, the construction of leadless chip carrier 12 is well known and includes an integrated circuit within a dielectric housing (typically plastic). The integrated circuit (not shown) within the housing of the LCC is connected to a plurality of metallized solder connects 18 positioned on the outside of LCC 12. Printed wiring board 14 is comprised of a non-conductive substrate 20 having a circuit pattern 22 thereon. At selected areas on circuit pattern 22, the pattern terminates at solder pads 24. It will be appreciated that solder connects 18 on leadless chip carrier 12 will mechanically and electrically connect to solder pads 24 of printed circuit pattern 22 via a reflow or other known process.

In accordance with the present invention, a suitable decoupling capacitor 16 is mounted over leadless chip carrier 12 and thereafter connected to selected solder pads 24 on printed wiring board 14. Decoupling capacitor 16 has flexible lead locations and multiple pins corresponding to each voltage level of the leadless chip carrier 12 so as to be tailored to a particular leadless chip carrier. The structure of decoupling capacitor 16 may be any one of a number of structures so long as it is dimensionally configured to be mounted directly over the leadless carrier. For example, decoupling capacitor 16 may have a configuration consisting of a dielectric material sandwiched between top and bottom conductors and encapsulated by a suitable outer insulating material with each conductor having a plurality of leads extending outwardly therefrom. Such a structure is shown and described in FIGS. 16–21 of U.S. application Ser. No. 027,932 filed contemporaneously with the present application and which is a continuation-in-part of U.S. application Ser. No. 763,826, (all of the contents of which have already been incorporated herein by reference). Alternatively, decoupling capacitor 16 could also have a structural configuration similar to the decoupling capacitor shown and described in FIGS. 24–28 of U.S. application Ser. No. 028,932 filed contemporaneously with the present application and which is a continuation-in-part of U.S. application Ser. No. 890,489 (which has also been incorporated herein by reference). In this latter application, the decoupling capacitor includes at least one multilayer capacitor chip which is sandwiched between a pair of conductors, each conductor having a plurality of leads extending outwardly therefrom. A decoupling capacitor having the multilayer capacitor chip structure of the latter application will have increased capacitance and also excellent electrical properties, particularly if the multilayer capacitive elements described in FIGS. 11–16 of the latter application utilized in conjunction therewith. Finally, decoupling capacitor 16 of FIGS. 1 and 2 may also have a construction which is similar to the decoupling capacitors described hereinafter in FIGS. 3–15 of the present application.

No matter which construction is used for decoupling capacitor 16, the capacitor will have a plurality of conductors in accordance with the present invention extending outwardly therefrom. These leads will be connected to the Vcc (power) and ground solder connects of the leadless chip carrier as shown in FIG. 1. It will be appreciated that capacitor 16 must be large enough so that leads 26 and 28 will overhang the sides of LCC 12 and make contact with solder pads 24 and printed wiring board 14.

Figure 3A:
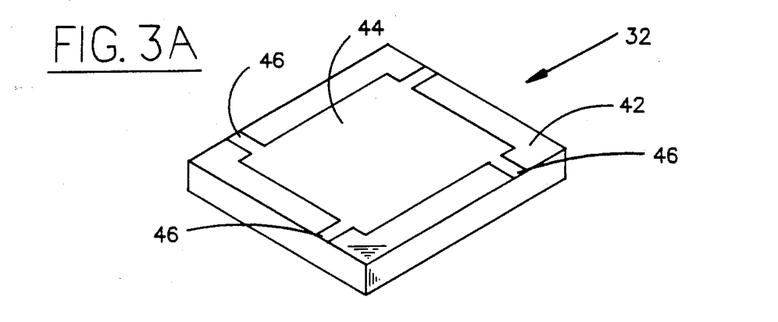
FIG. 3A is a perspective view of a lid for use in conjunction with a decoupling capacitor in accordance with the present invention.
Figure 3B:
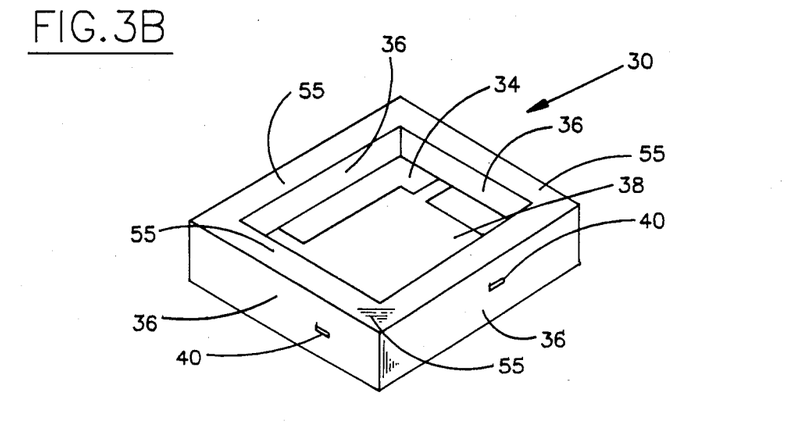
FIG. 3B is a perspective view of a base for use in conjunction with the lid shown in FIG. 3A.
Figure 4:
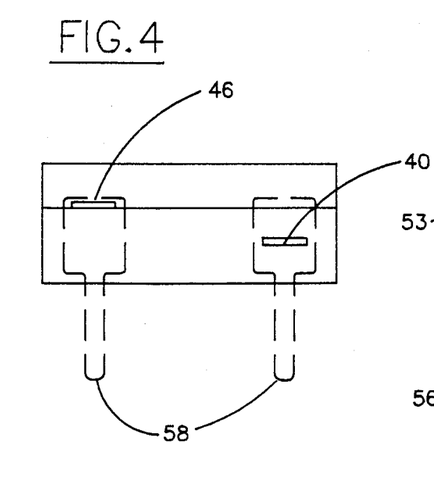
FIG. 4 is a side elevation view of the assembled lid and base of FIGS. 3A and 3B.
Figure 5:
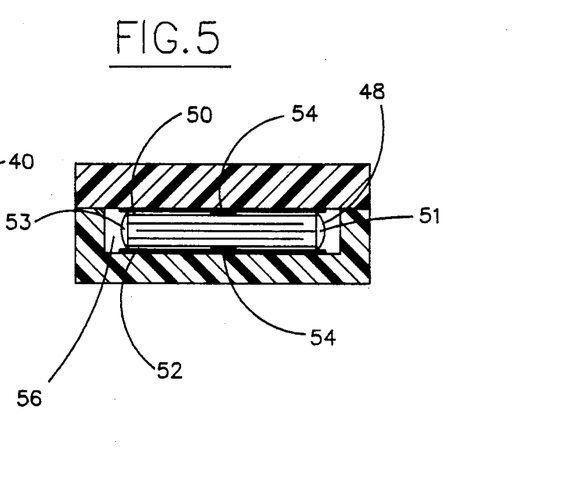
FIG. 5 is a cross-sectional elevation view through the assembly of FIG. 4.

While decoupling capacitor 16 may take on many different constructions, the following FIGS. 3–15 describe several preferred constructions. Turning now to FIGS. 3–5, a first embodiment of a decoupling capacitor in accordance with the present invention is comprised of a housing or base 30 and cover or lid 32. Housing 30 is comprised of a dielectric material (preferably a ceramic material) having a bottom base section 34 and four sidewalls 36 extending upwardly therefrom. Bottom 34 has a layer of metallization 38 at preselected sites as shown in FIG. 3B. Metallization 38 extends from bottom 34 through sidewalls 36 and terminates exteriorly of sidewalls 36 at tabs 40. Lid 32 is also composed of a suitable dielectric material (preferably a ceramic material) and includes a surface 42 having a metallized layer 44 thereon. As in metallized surface 38, metallized surface 44 also extends at preselected locations to terminate exteriorly of lid 32 at tabs 46. Next, a suitable multilayer capacitor element 48 is positioned within the space defined between walls 36 and bottom 34 of base 30. Preferably, multilayer capacitive element 48 (an example of which is shown in FIG. 5) has a parallel plate construction to define top and bottom exposed electrodes 50 and 52 having insulative end caps 51 and 53 on either side thereof. Such multilayer capacitive elements are fully described in U.S. application Ser. Nos. 890,489 and 839,686 filed Apr. 24, 1986. U.S. Ser. No. 839,686 is assigned to the assignee hereof and fully incorporated herein by reference thereto.

Multilayer capacitive element (MLC) 48 having respective electrodes 50 and 52 are electrically and mechanically connected to metallized surface 44 of lid 32 and metallized surface 38 of housing 30, respectively. Such attachment can be made by a conductive adhesive 54 such as a conductive polyimide or epoxy, or by solder. It will be appreciated that subsequent to assembly, lid 32 is oriented in an opposed position than is shown in FIG. 3A and positioned on the planar surfaces 55 defined by the tops of walls 36 to define a space 56 (FIG. 5) wherein multilayer capacitive element 48 is located. Top and bottom electrodes 50 and 52 of MLC 48 are thus connectorized to metallized surfaces 44 and 38, respectively as well as to tabs 46 and 40, respectively. Thereafter, conductive (metal) pins 58 and 60 are braised or otherwise attached to the sides of the decoupling capacitor package at those locations corresponding to tabs 46 and 40, respectively. The package may then be sealed with a polymeric adhesive or with solder.

As mentioned, the decoupling capacitor of FIGS. 3–5 may then be positioned on top of a leadless chip carrier as shown in FIGS. 1 and 2. Preferably, a thermally conductive adhesive is used to mechanically connect capacitor 16 to LCC 12. Electrical contact from decoupling capacitor 16 is made by soldering perimeter pins 58 and 60 of the decoupling capacitor to the appropriate solder pads at the base of the chip carrier. In an effort to provide a suitable heat sink, the body (consisting of base 30 and lid 32) of the decoupling capacitor is comprised of a ceramic material such as alumina, aluminum nitride, berylia, etc. The requirements for heat dissipation and the dimensions of the chip carrier will dictate the material of choice.

Figure 6:
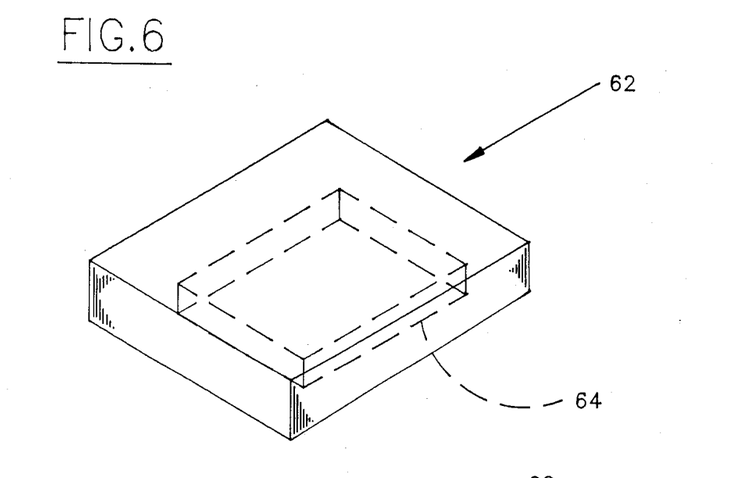
FIG. 6 is a perspective view of a lid portion for another embodiment of a decoupling capacitor in accordance with the present invention.
Figure 7:
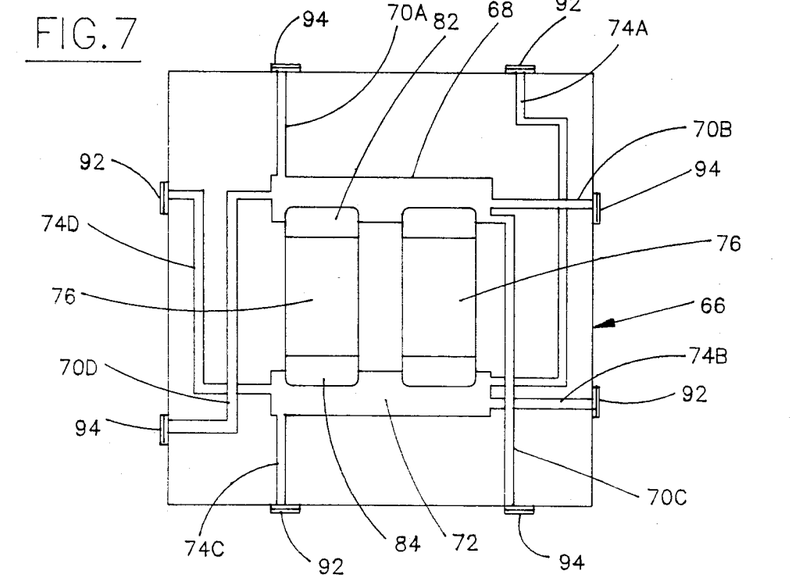
FIG. 7 is a plan view of the base portion for use in conjunction with the lid of FIG. 6.
Figure 8:
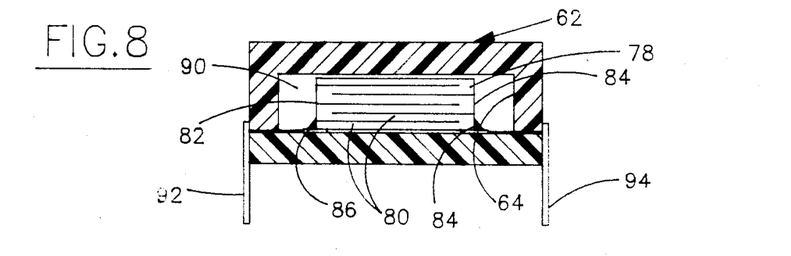
FIG. 8 is a cross-sectional elevation view of the assembled lid and base portion of FIGS. 6 and 7.

Yet another embodiment of a decoupling capacitor in accordance with the present invention which is particularly well suited for use in conjunction with leadless chip carriers is shown in FIGS. 6–8. This embodiment is comprised of a lid or cover 62 (see FIG. 6) having a recessed cavity 64 more clearly shown in FIG. 8. Lid 62 is adapted for connection to a base 66 (FIG. 7) which has a criss-cross pattern of metallized signal lines thereon to connect at least one multilayer capacitive element to alternating side pins. Still referring to base 66, a first metallized pattern is shown at 68 and comprises a rectangular area having four leads 70A, 70B, 70C and 70D extending therefrom, wherein each lead terminates at one of the four sides of base 66. Similarly, a second pattern 72 is comprised of a centralized metallized area having four leads 74 A–D extending therefrom with each lead terminating at one of the four sides of base 66. At least one multilayer capacitive element 76 is mounted on base 66. It will be appreciated that two multilayer capacitive elements 76 are shown by way of example in FIG. 7. Preferably, multilayer capacitive elements 76 are of the type having end terminated electrodes such as is shown in FIG. 14 of previously discussed and referenced U.S. Ser. No. 893,686. Such a MLC is comprised of a block of dielectric material (preferably ceramic) having interleaved layers of metallization 80 with alternating layers 80 being connected to end electrodes 82 and 84. Thus, as shown in FIGS. 7 and 8, end electrode 82 is electrically connected to circuit pattern 68 via solder or an electrical adhesive 86 while end electrode 84 is electrically connected to circuit pattern 72 via solder or the like 88. Cover 62 is then positioned on base 66 so as to define a space 90 for housing MLC 76. Lid 62 and substrate 66 are then sealed together with glass or any other suitable adhesive and leads or pins 92 are then side braised or otherwise attached to circuit pattern terminations 74 A–D and 70 A–D, respectively. If a glass seal is desired between cover 62 and base 66, MLC elements 76 may be attached with an inorganic filled adhesive to withstand the higher processing temperatures. As in the previously discussed embodiments described in FIGS. 3–5, the particular pattern and number of terminations 70 A–D and 74 A–D will be determined by the Vcc (power) and ground requirements of the leadless chip carrier to be decoupled.

Figure 9:
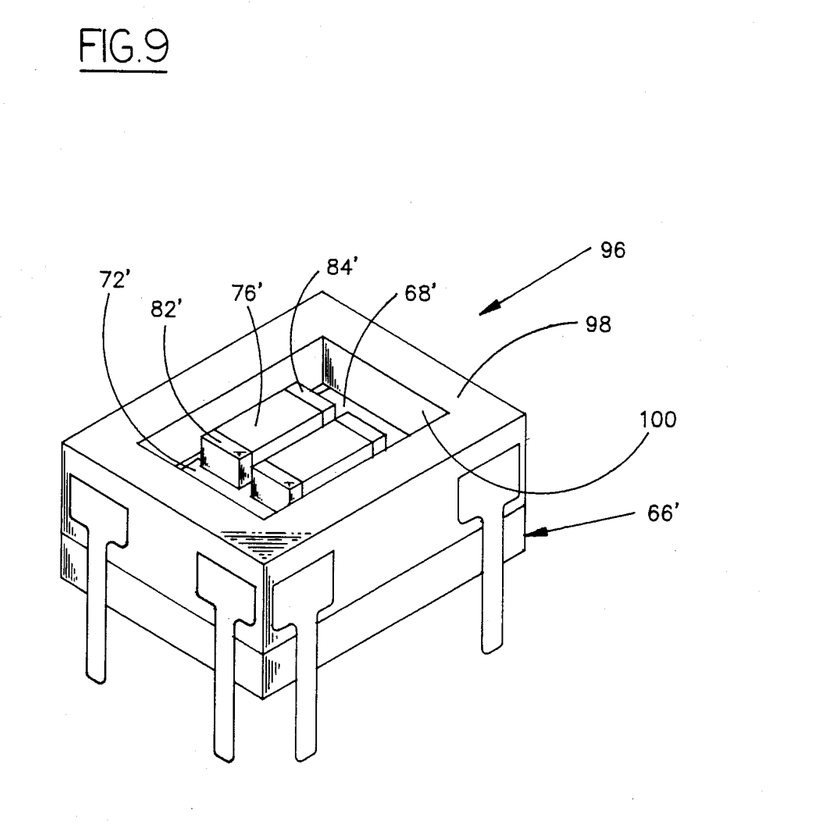
FIG. 9 is a perspective view of a third embodiment of a decoupling capacitor in accordance with the present invention.
Figures 10, 10A, 11, 11A:
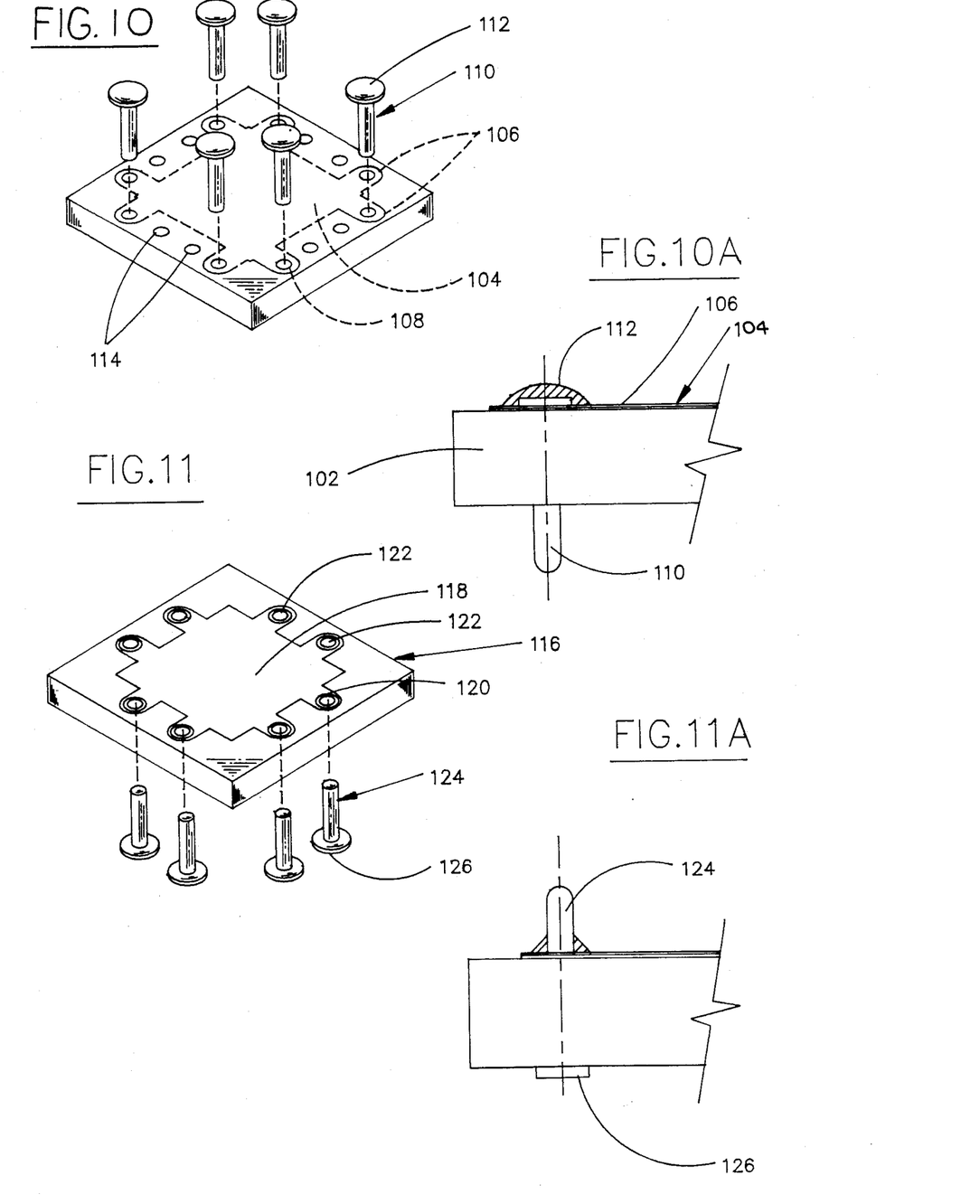
FIG. 10 is a perspective view of the bottom section of a decoupling capacitor in accordance with still another embodiment of the present invention.
FIG. 10A is an enlarged side elevation view of a section of the bottom portion of FIG. 10.
FIG. 11 is a perspective view of a top portion of a decoupling capacitor for use in conjunction with the bottom portion of FIG. 10.
FIG. 11A is an enlarged side elevation view of a section of the top portion of FIG. 11.

Still another embodiment of a decoupling capacitor in accordance with the present invention is shown in FIG. 9 at 96. Decoupling capacitor 96 is quite similar to the decoupling capacitor of FIGS. 6–8. The primary difference between the FIG. 9 and FIGS. 6–8 embodiments is in the lid or cover design. Thus, in contrast to lid 62 of FIG. 6, lid 98 in FIG. 9 has a window frame provided by an opening 100 through lid 98. Lid 98 thus leaves the center portion of the component open. The remaining elements of decoupling capacitor 96 are the same as in FIGS. 6–8. Lid 98 and base 66' are sealed together with glass and the side braised pins are attached as in the FIG. 6–8 embodiment. Next, at least one MLC 76' (in this example two MLC's) is attached by its respective end electrodes 82 and 84 to the metallized patterns 68' and 72' on base 66'. Opening 100 is then sealed over with blob top or other suitable insulation.

Still another embodiment of a decoupling capacitor in accordance with the present invention is shown in FIGS. 10–15. The decoupling capacitor of FIGS. 10–15 is comprised of dielectric material, preferably ceramic, having metallized surfaces printed or otherwise formed thereon. In this embodiment, two top and bottom planar sheets of dielectric material have metallized patterns formed thereon. Thus, in FIG. 10, a bottom substrate 102 is shown having a metallized pattern 104 formed thereon. Metallization 104 includes a plurality of tab extensions 106. Each tab extension 106 has an opening 108 extending completely through the dielectric substrate 102. Opening 108 is configured for receiving conductive pins 110 therein. It would be appreciated that each conductive pin 110 (see FIG. 10A) includes an upper retainer 112 having a shaft extending therefrom. Retainer 112 is larger than opening 106 and acts to retain pin 110 within opening 106. Additional openings 114 are also provided through substrate 102. As will be seen in the discussion further on, openings 114 (which are provided between tab extensions 106 and are electrically isolated from metallization 104) are configured for receiving conductive pins from the top substrate shown at 116 in FIG. 11.

Figure 12:
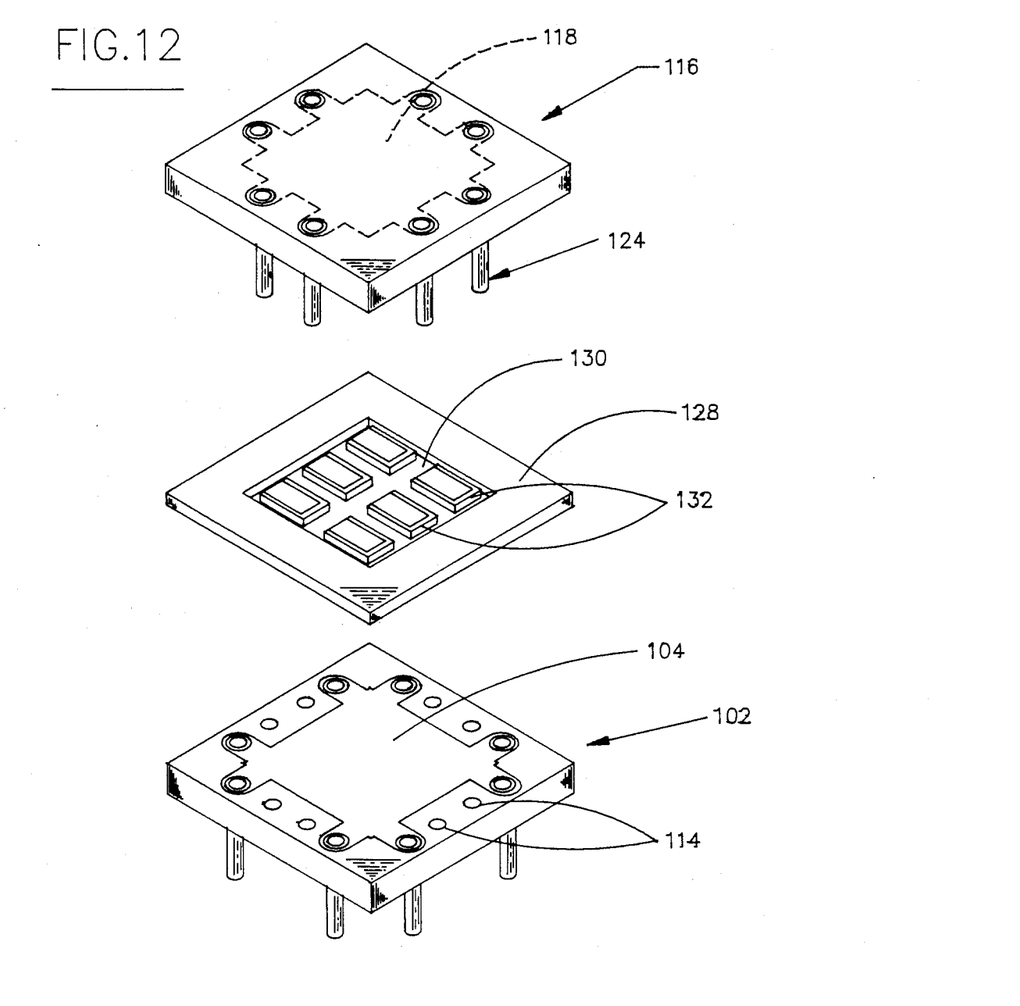
FIG. 12 is an exploded perspective view of the decoupling capacitor utilizing the top and bottom portions of FIGS. 10 and 11.
Figure 13:
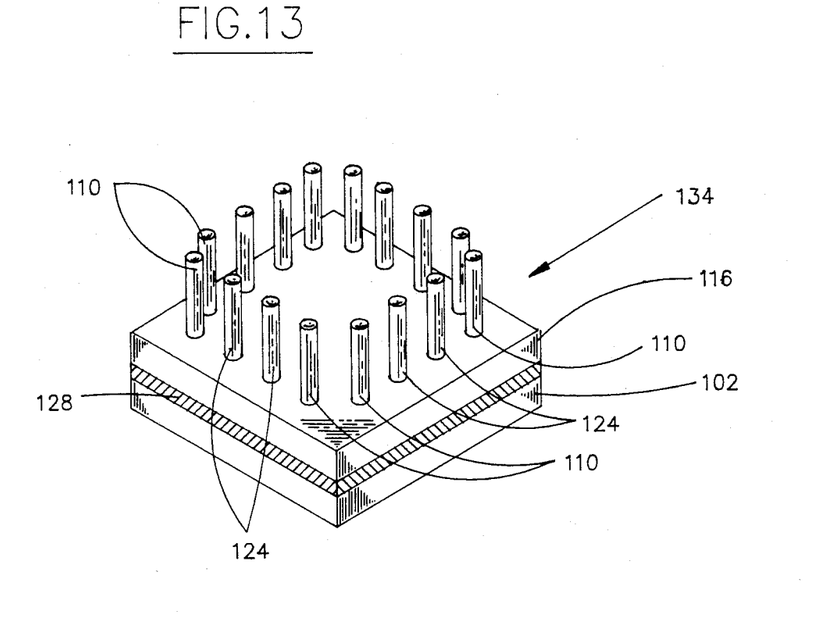
FIG. 13 is a bottom perspective view of the assembled decoupling capacitor of FIG. 12.
Figure 14:
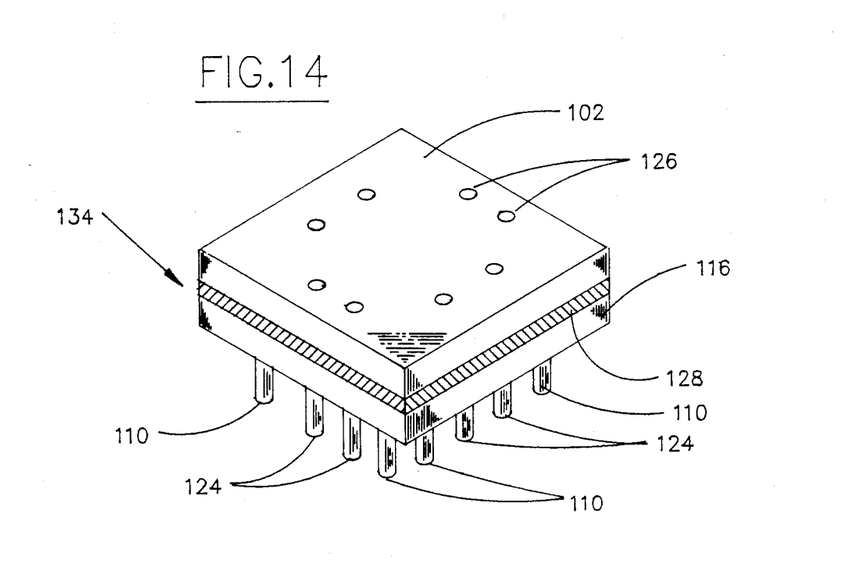
FIG. 14 is the top perspective view of the assembled decoupling capacitor of FIG. 12.

As in bottom substrate 102, top substrate 116 has a metallized pattern 118 thereon including a plurality of extension tabs 120 extending at preselected locations from the metallization. Each tab 120 includes an opening 122 through both the metallization 118 and substrate 116 which is configured for receiving conductive pins 124 therein. Conductive pins 124 are identical to conductive pins 110 and include a retainer 126 having a shaft extending therefrom (see FIG. 11A). It will be appreciated that openings 122 are of the same size and will align with openings 114 in substrate 102 when substrates 116 and 102 are brought together as shown in FIG. 12. In FIG. 12, conductive pins 110 and 124 have been inserted through openings 108 and 122 respectively, of substrates 102 and 116. (Note that top substrate 116 has been flipped relative to the position shown in FIG. 11 so that pins 124 point downwardly.) Sandwiched between substrates 116 and 102 is a spacer ring 128 which defines an opening 130 therein. At least one (and in this case six) multilayer capacitive chips 132 are then positioned within opening 130 of insulative spacer ring 128. MLC's 132 are preferably of the type which include top and bottom exposed electrodes such as capacitor 48 in FIG. 5 and which are described in detail in the aforementioned U.S. patent application Ser. Nos. 890,489 and 839,686. Thus, the top electrode on MLC 132 will electrically contact metallization 118 on top substrate 116 while the bottom electrode on MLC 132 will electrically contact metallization 104 on bottom substrate 102. MLC's 132 and insulating ring 128 are sandwiched between top and bottom substrates 116 and 102 such that conductive pins 124 are received by openings 114 in bottom substrate 102. The assembly can be held together by an appropriate adhesive, glass or be fired to provide the final decoupling capacitor device 134 shown in FIGS. 13 and 14.

Figure 15:
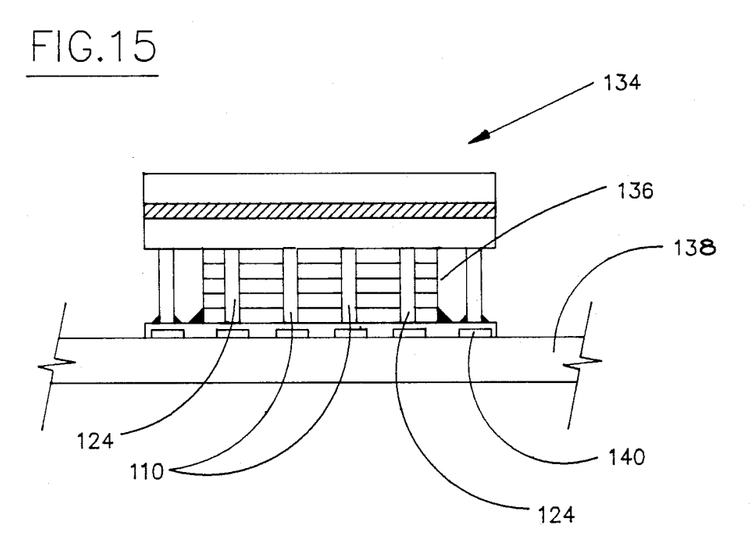
FIG. 15 is a side elevation view of a leadless chip carrier sandwiched between the decoupling capacitor of FIGS. 13 and 14 in a printed wiring board.

Turning now to FIG. 15, decoupling capacitor 134 is shown mounted over the top of a leadless chip carrier 136 on a printed wiring board substrate 138 in a manner similar to that shown in FIG. 1. It will be appreciated that pins 110 and 124 will attach to appropriate solder pads 140 on printed wiring substrate 138 along with solder connects (not shown) on leadless chip carrier 136.

While the various embodiments for decoupling capacitors shown in FIGS. 3–15 have been described for use in conjunction with leadless chip carriers, and particularly for use in mounting over the top of "leadless" chip carriers, it will be appreciated that these decoupling capacitors may also be used in conjunction with either pin grid array type integrated circuit packages or surface mountable "leaded" integrated circuit packages.

Figure 16A:
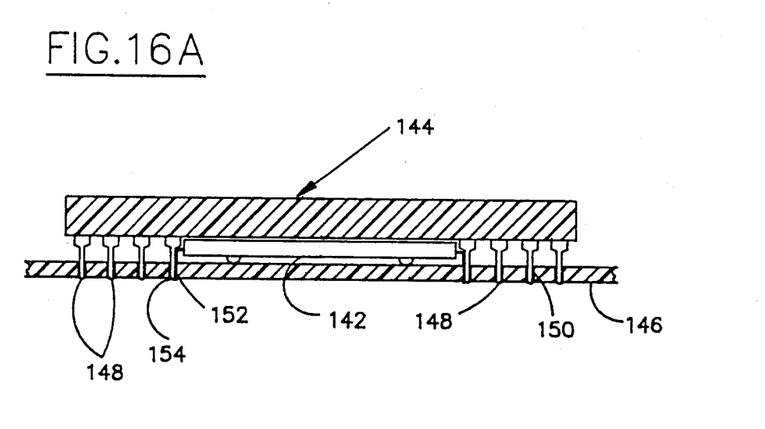
FIG. 16A is a cross-sectional elevation view of a decoupling capacitor of the present invention used in conjunction with a Pin Grid Array Package.
Figure 16B:
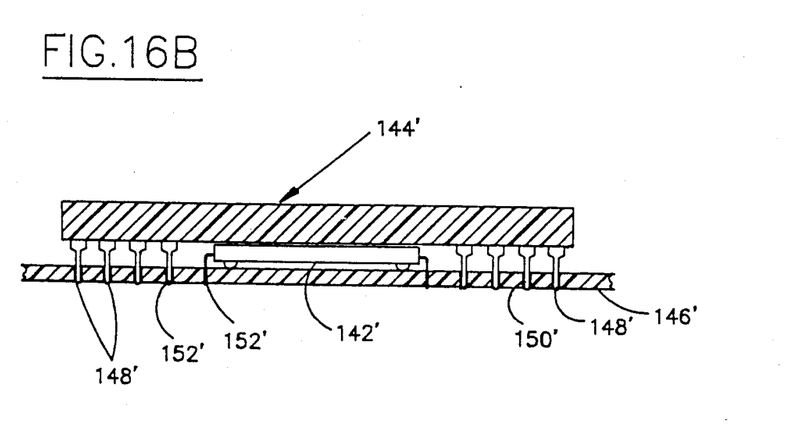
FIG. 16B is a cross-sectional elevation view of another embodiment of a decoupling capacitor used in conjunction with a Pin Grid Array Package.

Thus, for example, in FIGS. 16A and 16B, a decoupling capacitor 142 of the type described in FIGS. 3–15 is shown interposed between a well known PGA package 144 and a circuit board 146. A plurality of pins 148 from PGA package 144 are attached to circuit traces on circuit board 146 via through holes 150. Decoupling capacitor 142 has a dimensional configuration which permits the capacitor to be mounted within the central pin free area of the PGA package. Leads 152 from decoupling capacitor 142 are mounted in common through holes 150 with selected power level pins 154 from PGA package 144 as is described in detail in the aforementioned U.S. application Ser. No. 890,489.

In FIG. 16B, an assembly of a PGA package, decoupling capacitor and circuit board, similar to FIG. 16A is shown. However, in FIG. 16B, the decoupling capacitor 142' has smaller overall dimensions so that leads 152' will not share a through hole with the power and ground leads of the PGA package. Instead, leads 152' are in separate through holes which are connected to selected power level pins of the PGA package by suitable traces on or in circuit board 146'.

Figure 17:
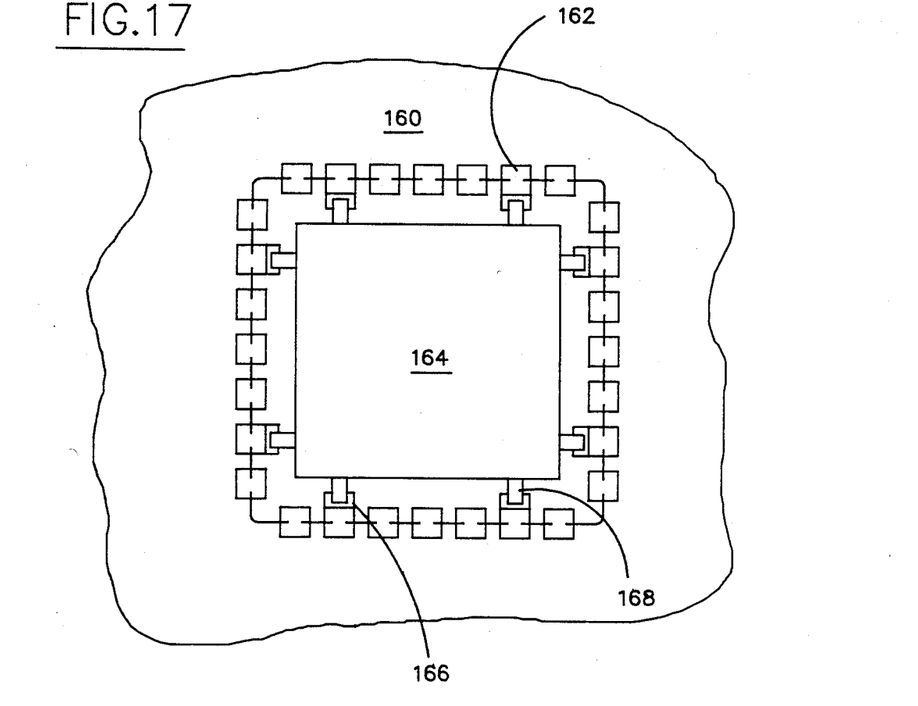
FIG. 17 is a plan view of a decoupling capacitor of the present invention for use in conjunction with a leaded surface mounted chip carrier.
Figure 18:
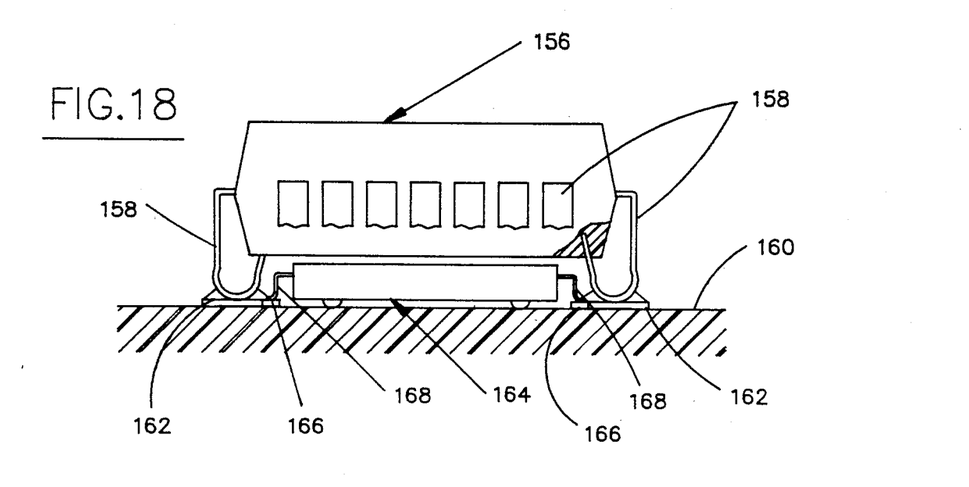
FIG. 18 is a side elevation view of the decoupling capacitor and leaded chip carrier of FIG. 17.

Turning now to FIGS. 17 and 18, a well known leaded chip carrier is shown at 156 having surface mountable leads 158 extending therefrom and attached to circuit board 160 via solder pads 162. A decoupling capacitor such as described in FIGS. 3-15 is identified at 164 in the central lead free area between leaded chip carrier 158 and circuit board 160. Solder pad extensions 166 on circuit board 160 effect electrical interconnection between leads 168 from decoupling capacitor 164 and solder pads 162 as described in detail in the aforementioned U.S. application Ser. No. 763,826. In the latter two applications, (i.e., PGA or leaded chip carrier packages) the decoupling capacitor of FIGS. 3-15 will have a dimensional configuration which will permit the capacitor to be mounted within the central pin free area of the PGA or leaded chip carrier packages as is more fully described in application Ser. Nos. 763,826 and 890,489.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electronic subassembly comprising:
   a surface mountable leadless integrated circuit chip carrier package, said leadless chip carrier package having an array of conductive connecting means arranged exteriorly on the perimeter thereof, at least some of the connecting means being first and second voltage level connecting means;
   a circuit board, said circuit board having conductive pads thereon receiving said connecting means from said leadless chip carrier package; and
   decoupling capacitor means, said decoupling capacitor means being mounted over and aligned with said leadless chip carrier package and electrically communicating with said circuit board, said capacitor means comprising;
   at least one multilayer capacitor chip having interleaved layers of conductive material and dielectric material with alternating layers of conductive material being electrically connected and defining first and second groups of conductive layers, each of said first and second groups having at least one exposed conductive layer defining a first exposed conductive layer and a second exposed conductive layer;
   first conductive layer means associated with ceramic substrate means and in electrical contact with said first exposed conductive layer and defining a first voltage level conductive layer means;
   second conductive layer means associated with ceramic substrate means and in electrical contact with said second exposed conductive layer and defining a second voltage level conductive layer means;
   a plurality of first leads in a predetermined configuration in electrical contact with said first conductive layer means and extending outwardly therefrom;
   a plurality of second leads in a predetermined configuration in electrical contact with said second conductive layer means and extending outwardly therefrom; and
   the configurations of said first and second leads corresponding to configurations of first and second voltage levels of connecting means of said leadless chip carrier package.

2. The subassembly of claim 1 wherein:
   said first and second leads are electrically connected to said conductive pads on said circuit board.

3. The subassembly of claim 1 wherein:
   said ceramic substrate means is substantially rectangular.

4. The subassembly of claim 3 wherein:
   said ceramic susbtrate mean is substantially square.

5. The subassembly of claim 1 wherein:
   said leads extend downwardly perpendicular to said first and second conductive layer means.

6. The subassembly of claim 1 wherein:
   said first conductive layer means and associated ceramic substrate means comprises a first layer of metallization disposed on a first ceramic substrate; and wherein
   said second conductive layer means and associated ceramic substrate means comprises a second layer of metallization disposed on a second ceramic substrate.

7. The subassembly of claim 6 wherein:
   said first layer of metallization terminates at a plurality of locations along the perimeter of said first ceramic substrate defining first terminals;
   said second layer of metallization terminates at a plurality of locations along the perimeter of said second ceramic substrate defining second terminals;
   said first layer of metallization is in facing relation to said second layer of metallization;
   said first leads being connected to said first terminals; and
   said second leads being connected to said second terminals.

8. The subassembly of claim 6 wherein:
   said first ceramic substrate defines a top substrate and includes a plurality of first openings through said top substrate and through said metallization first layer, the number of first openings corresponding to said plurality of first leads;
   said second ceramic substrate defines a bottom substrate and includes a plurality of second openings through said bottom substrate and through said metallization second layer, the number of second openings corresponding to said plurality of second leads;
   said bottom substrate further including a plurality of third openings through said bottom substrate and electrically isolated from said metallization second layer;
   said first layer of metallization in facing relation to said second layer of metallization with said first and third openings being mutually aligned;
   said first leads being received in said first and third openings and said second leads being received in said second openings;
   said first exposed conductive layer of said multilayer capacitor chip in electrical contact with said first layer of metallization; and
   said second exposed conductive layer of said multilayer capacitor chip in electrical contact with said second layer of metallization.

9. The capacitor of claim 8 including:

an electrically insulative spacing layer, said spacing layer having at least one opening therethrough for receiving said at least one multilayer capacitor chip, said spacing layer being sandwiched between said first and second ceramic substrates with said opening communicating between said first and second ceramic substrates.

10. The subassembly of claim 1 wherein:

said first exposed conductive layer and said second exposed conductive layer are substantially parallel to each other and to said first and second conductive layer means.

11. The subassembly of claim 10 wherein:

said dielectric layers of said multilayer capacitor chip include a pair of opposed end surfaces and top and bottom surfaces;

said first exposed conductive layer on said top surface of said dielectric material and said second exposed conductive layer being disposed on said bottom surface of said dielectric material;

a first conductive end termination on one of said opposed end surfaces of said dielectric material and a second conductive end termination on the other of said opposed end surfaces of said dielectric material;

said alternating layers of said interleaved conductive layers terminating at said first and second conductive end terminations with said first and second exposed conductive layers being connected and substantially transverse to respective first and second conductive end terminations.

12. The subassembly of claim 11 including:

an electrically insulative cap being provided over each of said first and second conductive end terminations wherein said conductive end terminations are encapsulated.

13. The subassembly of claim 1 wherein:

said first conductive layer means associated with ceramic substrate means comprises a first layer of metallization disposed on a first ceramic substrate;

said second conductive layer means associated with ceramic substrate means comprises a second layer of metallization disposed on said first ceramic substrate, said first layer of metallization being electrically isolated from said second layer of metallization.

14. The subassembly of claim 13 wherein:

said first layer of metallization terminates at a plurality of locations along the perimeter of said first ceramic substrate defining first terminals;

said second layer of metallization terminates at a plurality of locations along the perimeter of said first ceramic substrate defining second terminals;

said first leads being connected to said first terminals; and said second leads being connected to said second terminals.

15. The subassembly of claim 13 including:

ceramic cover means disposed on said first ceramic substrate.

16. The subassembly of claim 15 including:

a recess in said cover means, said at least one multilayer capacitor chip being disposed in said recess.

17. The subassembly of claim 15 including:

an opening through said cover means, said at least one multilayer capacitor chip being disposed in said opening; and insulative material in said opening surrounding said capacitor chip.

18. The subassembly of claim 1 wherein:

said dielectric layers of said multilayer capacitor chip include a pair of opposed end surfaces and top and bottom surfaces;

a first conductive end termination on one of said opposed end surfaces of said dielectric material defining said first exposed conductive layer and a second conductive end termination on the other of said opposed end surfaces of said dielectric material defining said second exposed conductive layer; and said alternating layers of said interleaved conductive layers terminating at said first and second conductive end terminations.

19. A decoupling capacitor for use with a pin grid array package, surface mounted leaded chip carrier or surface mounted leadless chip carrier wherein the pin grid array package, surface mounted leaded chip carrier package and surface mounted leadless chip carrier package have an array of conductive connecting means arranged exteriorly on the perimeter thereof, at least some of the conductive connecting means being first and second voltage level conductive connecting means, the capacitor including:

at least one multilayer capacitor chip having interleaved layers of conductive material and dielectric material with alternating layers of conductive material being electrically connected and defining first and second groups of conductive layers, each of said first and second groups having at least one exposed conductive layer defining a first exposed conductive layer and a second exposed conductive layer;

first conductive layer means associated with ceramic substrate means and in electrical contact with said first exposed conductive layer and defining a first voltage level conductive layer means;

second conductive layer means associated with ceramic substrate means and in electrical contact with said second exposed conductive layer and defining a second voltage level conductive layer means;

a plurality of first leads in a predetermined configuration in electrical contact with said first conductive layer means and extending outwardly therefrom;

a plurality of second leads in a predetermined configuration in electrical contact with said second conductive layer means and extending outwardly therefrom;

the configurations of said first and second leads corresponding to configurations of first and second voltage levels of connecting means of the pin grid array package, surface mounted leaded chip carrier package or surface mounted leadless chip carrier package.

20. The capacitor of claim 19 wherein:

said ceramic substrate means is substantially rectangular.

21. The capacitor of claim 20 wherein:

said ceramic substrate means is substantially square.

22. The capacitor of claim 19 wherein:

said leads extend downwardly perpendicular to said first and second conductive layer means.

23. The capacitor of claim 19 wherein said conductive connecting means are leads and wherein said pin grid array package and said surface mounted leaded chip carrier have a central lead free area surrounded by said leads and including:

an insulating material surrounding said at least one multilayer capacitor chip, first and second conductive layer means and associated ceramic substrate means, said first and second leads extending through said insulating material; and said at least one multilayer capacitor chip, first conductors, second conductors and insulating material defining an insulated assembly, the size of said insulated assembly being less than the size of the central lead free area.

24. The capacitor of claim 23 wherein:
said insulated assembly is substantially rectangular.

25. The capacitor of claim 24 wherein:
said insulated assembly is substantially square.

26. The capacitor of claim 23 wherein:
said multilayer capacitor chip, first and second conductive layer means and associated ceramic substrate means, first leads, second leads and insulating material have a size which is less than the size of the central lead free area.

27. The capacitor of claim 19 wherein:
said first conductive layer means and associated ceramic substrate means comprises a first layer of metallization disposed on a first ceramic substrate; and wherein
said second conductive layer means and associated ceramic substrate means comprises a second layer of metallization disposed on a second ceramic substrate.

28. The capacitor of claim 27 wherein:
said first layer of metallization terminates at a plurality of locations along the perimeter of said first ceramic substrate defining first terminals;
said second layer of metallization terminates at a plurality of locations along the perimeter of said second ceramic substrate defining second terminals;
said first layer of metallization is in facing relation to said second layer of metallization;
said first leads being connected to said first terminals; and
said second leads being connected to said second terminals.

29. The capacitor of claim 27 wherein:
said first ceramic substrate defines a top substrate and includes a plurality of first openings through said top substrate and through said metallization first layer, the number of first openings corresponding to said plurality of first leads;
said second ceramic substrate defines a bottom substrate and includes a plurality of second openings through said bottom substrate and through said metallization second layer, the number of second openings corresponding to said plurality of second leads;
said bottom substrate further including a plurality of third openings through said bottom substrate and electrically isolated from said metallization second layer;
said first layer of metallization in facing relation to said second layer of metallization with said first and third openings being mutually aligned;
said first leads being received in said first and third openings and said second leads being received in said second openings;

said first exposed conductive layer of said multilayer capacitor chip in electrical contact with said first layer of metallization; and
said second exposed conductive layer of said multilayer capacitor chip in electrical contact with said second layer of metallization.

30. The capacitor of claim 29 including:
an electrically insulative spacing layer, said spacing layer having at least one opening therethrough for receiving said at least one multilayer capacitor chip, said spacing layer being sandwiched between said first and second ceramic substrates with said opening communicating between said first and second ceramic substrates.

31. The capacitor of claim 19 wherein:
said first exposed conductive layer and said second exposed conductive layer are substantially parallel to each other and to said first and second conductive layer means.

32. The capacitor of claim 31 wherein:
said dielectric layers of said multilayer capacitor chip include a pair of opposed end surfaces and top and bottom surfaces;
said first exposed conductive layer on said top surface of said dielectric material and said second exposed conductive layer being disposed on said bottom surface of said dielectric material;
a first conductive end termination on one of said opposed end surfaces of said dielectric material and a second conductive end termination on the other of said opposed end surfaces of said dielectric material;
said alternating layers of said interleaved conductive layers terminating at said first and second conductive end terminations with said first and second exposed conductive layers being connected and substantially transverse to respective first and second conductive end terminations.

33. The capacitor of claim 32 including:
an electrically insulative cap being provided over each of said first and second conductive end terminations wherein said conductive end terminations are encapsulated.

34. The capacitor of claim 19 wherein:
said first conductive layer means and associated ceramic substrate means comprises a first layer of metallization disposed on a first ceramic substrate;
said second conductive layer means and associated ceramic substrate means comprises a second layer of metallization disposed on said first ceramic substrate, said first layer of metallization being electrically isolated from said second layer of metallization.

35. The capacitor of claim 34 wherein:
said first layer of metallization terminates at a plurality of locations along the perimeter of said first ceramic substrate defining first terminals;
said second layer of metallization terminates at a plurality of locations along the perimeter of said first ceramic substrate defining second terminals;
said first leads being connected to said first terminals; and
said second leads being connected to said second terminals.

36. The subassembly of claim 34 including:
ceramic cover means disposed on said first ceramic substrate.

37. The subassembly of claim 36 including:

a recess in said cover means, said at least one multilayer capacitor chip being disposed in said recess.

38. The subassembly of claim 36 including:

an opening through said cover means, said at least one multilayer capacitor chip being disposed in said opening; and insulative material in said opening surrounding said capacitor chip.

39. The subassembly of claim 19 wherein:

said dielectric layers of said multilayer capacitor chip include a pair of opposed end surfaces and top and bottom surfaces;

a first conductive end termination on one of said opposed end surfaces of said dielectric material defining said first exposed conductive layer and a second conductive end termination on the other of said opposed end surfaces of said dielectric material defining said second exposed conductive layer; and said alternating layers of said interleaved conductive layers terminating at said first and second conductive end terminations.

* * * * *